US012689397B2

(12) United States Patent
Thirunarayanan et al.

(10) Patent No.: US 12,689,397 B2
(45) Date of Patent: Jul. 21, 2026

(54) DEVICE FOR GENERATING TRANSMISSION PULSES BASED ON MULTIPLE KERNEL PULSES AND METHOD THEREFORE

(71) Applicant: 3db Access AG, Thalwil (CH)

(72) Inventors: Raghavasimhan Thirunarayanan, Thalwil (CH); David Barras, Thalwil (CH); Silvan Wehrli, Thalwil (CH)

(73) Assignee: 3db Access AG, Thalwil (CH)

( * ) Notice: Subject to any disclaimer, the term of this patent is extended or adjusted under 35 U.S.C. 154(b) by 690 days.

(21) Appl. No.: 17/895,786

(22) Filed: Aug. 25, 2022

(65) Prior Publication Data

US 2023/0067529 A1     Mar. 2, 2023

(30) Foreign Application Priority Data

Aug. 26, 2021     (LU) .................................. LU102856

(51) Int. Cl.
*H04B 1/04*          (2006.01)
*H03F 3/24*          (2006.01)
*H04W 88/02*          (2009.01)

(52) U.S. Cl.
CPC .............. *H04B 1/04* (2013.01); *H03F 3/245* (2013.01); *H03F 2200/102* (2013.01); *H03F 2200/451* (2013.01); *H04B 2001/0408* (2013.01); *H04W 88/028* (2013.01)

(58) Field of Classification Search
CPC ... H04B 1/04; H04B 2001/0408; H03F 3/245; H03F 2200/102; H03F 2200/451; H03F 4/00–02
See application file for complete search history.

(56) References Cited

U.S. PATENT DOCUMENTS

| | | | |
|---|---|---|---|
| 10,171,129 B1 * | 1/2019 | Hammerschmidt | ......................... G01S 13/0209 |
| 2006/0140249 A1 * | 6/2006 | Kohno | ................. H04B 1/7172 375/130 |
| 2007/0286260 A1 | 12/2007 | Molisch et al. | |
| 2008/0056419 A1 * | 3/2008 | Lee | .......................... H04L 7/048 375/355 |
| 2009/0258612 A1 * | 10/2009 | Zhuang | .................... H03C 5/00 455/110 |
| 2015/0092821 A1 * | 4/2015 | Gupta | ................ H04B 1/71637 375/148 |

(Continued)

FOREIGN PATENT DOCUMENTS

| | | |
|---|---|---|
| EP | 1280308 A2 | 1/2003 |
| GB | 2382007 A | 5/2003 |

OTHER PUBLICATIONS

T. Norimatsu, et al., "A UWB-IR Transmitter with Digitally Controlled Pulse Generator", IEEE Journal of Solid-State Circuits, vol. 42, No. 6, Jun. 2007, pp. 1300-1309.

(Continued)

*Primary Examiner* — San Htun
(74) *Attorney, Agent, or Firm* — BLANK ROME LLP

(57)          ABSTRACT

Disclosed is a device for generating a transmission pulse, configured to:
    obtain information about a transmission pulse, wherein the information comprises a pulse shape;
    generate a plurality of kernel pulses on the basis of the pulse shape;
    form a transmission pulse based on the plurality of kernel pulses.

11 Claims, 4 Drawing Sheets

(56) References Cited

U.S. PATENT DOCUMENTS

2021/0156982 A1* 5/2021 Stettiner ................... G01S 7/35

OTHER PUBLICATIONS

P. Li, et al., "Gigabit/s Photonic Generation, Modulation, and Transmission for a Reconfigurable Impulse Radio UWB Over Fiber System" IEEE Photonics Journal, vol. 4, No. 3, Jun. 2012, 14 pgs.

* cited by examiner

<table>
<tr><td>1</td><td>2</td></tr>
</table>

DEVICE FOR GENERATING TRANSMISSION PULSES BASED ON MULTIPLE KERNEL PULSES AND METHOD THEREFORE

RELATED APPLICATION

This application claims the benefit of Luxembourgish Application No. LU102856, filed Aug. 26, 2021. The entire contents of this application is hereby incorporated by reference.

TECHNICAL FIELD

The field of this disclosure relates to devices for generating one or more transmission pulses, in particular for ultra-wideband communication. The disclosure also relates to methods for generating one or more transmission pulses and to respective computer programs.

BACKGROUND

Transmission pulses in modern radio technology need to fulfil a number of requirements, such as bandwidth constraints and power-related requirements, such as the peak-to-average-power ratio (PAPR). This is due to the high success of radio technology in the last decades that has led to a comprehensive adaptive radiation and to the necessity of using existing bandwidth (in wired or wireless communications) efficiently.

In ultra-wideband (UWB) communication, for example, there has been a proliferation of devices with impulse-radio UWB (IR-UWB) technology. The widespread use of UWB capable devices has resulted in the codification of a separate standard, IEEE 802.15.4z-2020. The standard specifies two alternatives of IR-UWB physical layer communication, High Rate Pulse (HRP) and Low Rate Pulse (LRP) communication. Both can be used for precise distance measurement and localization applications. Also in other communication fields, e.g. in mobile communications (WIFI, 5G, 6G, etc.), various physical layer requirements exist.

However, the different requirements have caused different implementations for the generation of different pulse forms. A single integrated radio for different kinds of pulse forms based on current technology, although highly desirable, is usually not regarded as efficient. For example, HRP- and LRP-pulses differ in repetition frequency and PAPR. HRP-pulses are communicated at a higher rate than in LRP-pulses. On the other hand, LRP-pulses usually have a higher PAPR than HRP-pulses. Further, due to a more complex digital signal processing the generation of HRP-pulses consumes more power than the generation of LRP-pulses. Therefore, LRP-radios are usually used in low-energy systems, like key-fobs. HRP-radios are usually used in more energy-independent systems, such as smartphones. The radios for generating of HRP- and LRP-transmission-pulses have a different implementation. Currently, no commercially accepted radio exists that efficiently can be used for HRP- and LRP-communication on the same time. This precludes the universal deployment of integrated HRP- and LRP-systems.

IR-UWB is only an example of lacking radio integration. Radio integration, i.e. a single radio for different kinds of transmission pulses, can be beneficial for all communication fields. Improvements in these areas are desirable.

DESCRIPTION

An object of the embodiments disclosed in the following is to improve a generation of a transmission pulse.

This problem is solved by the disclosed embodiments, which are in particular defined by the subject matter of the independent claims. The dependent claims provide further embodiments. In the following, different aspects and embodiments of these aspects are disclosed, which provide additional features and advantages.

Some embodiments solve the problem of generating different transmission-pulses efficiently in a single device. These embodiments comprise generating a plurality of rectangular kernel pulses with equal amplitude based on a pre-defined pulse shape. Each kernel pulse is then amplified by a pre-defined gain associated with the respective kernel pulse. The kernel pulses are selected such that the sum of the amplified kernel pulses resembles the pre-defined pulse shape to form the transmission pulse. In order to generate transmission pulses with lobes of different polarities (i.e. positive and negative lobes), each kernel pulse is further related to an information that defines if the kernel pulse has to be amplified positively or negatively. Since the transmission pulses are composed out of multiple amplified kernel pulses, transmission pulses with different pulse shapes and/or with different PAPRs can be generated efficiently. In order to generate overlapping transmission pulses, a plurality of stages operate concurrently. Each stage is capable of forming a single transmission pulse. The transmission pulses of the different stages are then integrated to the output signal.

In the remainder, further aspects and embodiments of these aspects are disclosed.

A first aspect relates to a device for generating a transmission pulse, configured to:
- obtain information about a transmission pulse, wherein the information comprises a pulse shape;
- generate a plurality of kernel pulses on the basis of the pulse shape;
- form a transmission pulse based on the plurality of kernel pulses.

The device can be configured for generating all kinds of transmission pulses.

Information about the transmission pulse can in particular comprise the shape of the transmission pulse or a part of the shape of the transmission pulse to be generated. The pulse shape can be defined by one or more parameters. Furthermore, the information can comprise a starting time of the transmission pulse. Additionally or alternatively, the information can comprise the number of transmission pulses within a pre-defined interval. This information can be used to determine whether consecutive pulses will have overlapping portions. This will be explained in more detail later. Additionally or alternatively, the information can comprise quantization-related information. This information defines how close the pulse shape obtained by the device should be resembled by the generated transmission pulse. Based on the quantization resolution the number of kernel pulses and/or the time between two consecutive kernel pulses can be determined.

The generation of a plurality of kernel pulses can comprise kernel pulses of different length. Additionally or alternatively, kernel pulses can be generated as constant absolute values with a certain length. That means kernel pulses can be generated as digital signals having only two states. Advantageously, this facilitates an implementation of a corresponding device. Additionally or alternatively, kernel pulses can be generated with pre-defined amplitudes and/or pre-defined lengths. Furthermore, kernel pulses can have a rectangular shape. This facilitates the generation of the transmission pulse based on the kernel pulses. However, they can also have any other shape.

The device can be configured to build a large variety of transmission pulses. Alternatively, it can be configured to build only one or a few transmission pulses. The lower the number of possible transmission pulse types the lower also the complexity of the device. For example, a device for a single type of transmission pulses requires fewer pre-defined kernel pulses than a device that is configured for a plurality of transmission pulses.

The integration of the kernel pulses to form the transmission pulse can comprise forming a unipolar pulse, e.g. a Gaussian pulse. Additionally or alternatively, a transmission pulse can also have a multipolar form. This will be explained later. The integration of the kernel pulses can comprise a weighting of the kernel pulses by an amplifier, such that the sum of all weighted kernel pulses forms the transmission pulse. The integration of the kernel pulses can be implemented by current summation.

The transmission pulse can in particular form a base band signal, which is modulated by a carrier signal. This is explained later.

An embodiment of the first aspect relates to a device for generating a transmission pulse, wherein the kernel pulses are based on a pre-defined time quantization.

Time quantization can be a uniform time quantization with equal quantization steps. Additionally or alternatively, time quantization can also be non-uniformly, in particular such that a uniform amplitude quantization can be achieved.

An embodiment of the first aspect relates to a device for generating a transmission pulse, wherein the kernel pulses are based on a quantization resolution; and wherein the quantization resolution is in particular comprised in the information about the transmission pulse.

A quantization resolution can in particular relate to a quantization error due to a uniform or a nonuniform time quantization and/or amplitude quantization. In particular based on a pre-defined quantization resolution the device can select a number of kernel pulses necessary to generate the desired transmission pulse. Furthermore, based on the quantization resolution, the device can determine which amplitude weighting or amplitude quantization is necessary for each of the kernel pulses in order to generate a transmission pulse with the desired quantization resolution.

An embodiment of the first aspect relates to a device for generating a transmission pulse, wherein the transmission pulse and/or one or more kernel pulses are based on a starting time; and wherein the starting time is in particular comprised in the information about the transmission pulse.

The starting time can be provided to the device together with a clock signal or as a clock signal only, if the device determines a starting time on its own.

An embodiment of the first aspect relates to a device for generating a transmission pulse, wherein the pulse shape comprises a plurality of lobes with different polarity; and
    wherein the device is configured to invert at least partly one or more kernel pulses on the basis of the polarity of a lobe of the pulse shape.

Transmission pulses can have different shapes. A transmission pulse can have a unipolar shape such as a Gaussian pulse. Additionally or alternatively, a transmission pulse can have a multipolar shape. Transmission pulses with multipolar shape can have for example at least one positive lobe and at least one negative lobe. Multipolar shapes can have a main lobe with one or more precursors and/or one or more successors. An example for a multipolar pulse with precursors and successors are a raised cosine pulse and a sinc-pulse. Both pulse types have positive and negative lobes. They are used in signal communication because they occupy a smaller bandwidth than a more rectangular pulse. Such bandwidth-constraint pulse types can be defined in a standard governing the respective communication type.

For IR-UWB the standard defines different transmission pulse shapes. In the case of HRP-communication, transmission pulses with and without precursors are supported. If the transmission pulse has precursors, then it shall be a Root-Raised Cosine shape over +/−3 chip periods. Without a precursor, the pulse shape includes successors which extend over four chip periods. In case of LRP pulses, the monotonous rise time of the pulse is specified with the option of a single successor. The precursors and the successors in these transmission pulse types have different amplitudes as well. The pulse generation should be capable of handling this phase flipping as well as the different rise and fall times dictated by these pulse shapes.

Based on an at least partly inverted kernel pulses negative parts of the transmission can be generated. For example, a subset of the plurality of kernel pulses generated for generating a multipolar transmission pulse is directed to a negative lobe of this transmission pulse. By inverting the subset of kernel pulses such that they have a negative polarity the negative lobe can generated by just weighting and integrating the negative kernel pulses. If a kernel pulse only belongs partly to a negative lobe, then at least this part of the kernel pulse should be inverted. The information related to the inversion, in particular to the time of the inversion, can be provided by a phase signal, which indicates a shift by $\pi(=180$ degrees).

Kernel pulses can be shifted directly. Kernel pulses can also be shifted indirectly, for example by shifting the mean value, a phase, and/or a frequency of the carrier signal.

Instead of inverting the kernel pulse, it is also possible to give to the amplifier the information that one or more kernel pulses or at least a part of one or more kernel pulses should be amplified in the other direction than the other kernel pulses.

An embodiment of the first aspect relates to a device for generating a transmission pulse, wherein the inversion of a kernel pulse depends:
    on a minimum and/or a zero-crossing of the pulse shape;
      and/or
    on a minimum of a non-negative pulse formed by integrated kernel pulses.

Inversion of kernel pulses can in particular take place where a minimum of an energy of a pulse shape of the transmission pulse occurs. For multipolar pulse shapes, a minimum energy occurs on the zero crossings of the pulse shape, that means between the lobes of different polarities of the pulse shape.

However, if kernel pulses are only positive pulses and therefore resemble the pulse shape only as an absolute value and due to a time quantization, zero points of the pulse shape might not result of respective zero values of the integrated kernel pulses. Therefore, an inversion can in particular take place at a zero crossing of the pulse shape and/or at a minimum of a (quantized) pulse shape formed by integrated kernel pulses. Advantageously, by selecting the inversion points based on a minimal energy of the pulse shape, an introduction of high-frequency glitches due to the inversion can be avoided.

An embodiment of the first aspect relates to a device for generating a transmission pulse, configured to:
    adapt a pulse amplitude formed by integrated kernel pulses such that one or more minima are changed from a non-zero value to zero.

A quantized pulse shape by non-inversed kernel pulses can have non-zero minima. These non-zero minima can be artificially adapted to zero. Then the inversion of a kernel pulse can take place at a point or at a plurality of points, where the pulse shape has zero energy and therefore an inversion at this point would not induce or at least minimize high-frequency glitches to the transmission signal.

An embodiment of the first aspect relates to a device for generating a transmission pulse, wherein a transmission pulse is generated by a weighted summation of the kernel pulses.

Uniform kernel pulses are provided each having the same amplitude. The uniform kernel pulses only differ in starting time and duration. The uniform pulses can be amplified with different amplification factors (i.e. weighted) in order to generate the desired transmission pulse. In another alternative each of the kernel pulses is generated directly with an assigned amplitude. Both alternatives can also be applied to kernel pulses or parts of kernel pulses that are inverted in order to generate a negative lobe of a transmission pulse.

An embodiment of the first aspect relates to a device for generating a transmission pulse, configured to generate a plurality of transmission pulses concurrently, in particular based on a time between two consecutive transmission pulses and/or on a spreading factor of IR-UWB for which the transmission pulse is used.

Depending on the communication scheme, transmission pulses, in particular multipolar (i.e. bipolar) transmission pulses, can be sent so shortly after one another that parts of two consecutive transmission pulses overlap each other. The device according to the first aspect can be configured such that also this kind of communication can be realized. In particular the device can be configured to comprise and operate a plurality of stages. Each stage can be configured to generate a transmission pulse on its own, in particular configured according to one of the preceding or succeeding embodiments. For example in UWB HRP-communication the duration between two consecutive transmission pulses can be so short that eight stages or even more can be necessary in order to generate transmission pulse sequences with overlapping pulses. Therefore, at least eight stages may be required. Since LRP-communication has a smaller pulse repetition frequency not all of these stages might be used in order to generate an LRP-transmission-pulse-sequence with the same device.

In particular each stage can be configured such that it can obtain information about a transmission pulse. Each stage can be configured to also obtain information about when its transmission pulse should start. Then each stage can be configured to generate its transmission pulse based on a plurality of kernel pulses on the basis of its obtained pulse shape of its transmission pulse. Furthermore, each stage can be configured to integrate the kernel pulses in order to form its transmission pulse. Therefore, in particular each stage can be configured to inverse at least partly one or more kernel pulses, in order to being able to generate multipolar transmission pulses. The different transmission pulses are then integrated to the final signal, in particular by current summation. This is explained later in more detail.

An embodiment of the first aspect relates to a device for generating a transmission pulse, configured to integrate the plurality of transmission pulses, in particular by current summation.

An embodiment of the first aspect relates to a device for generating a transmission pulse, configured to modulate formed kernel pulses with a pre-defined carrier signal.

The transmission pulse can be regarded as a baseband signal that can be modulated by one or more carrier signals. In particular a certain subset of pulses can be modulated by the first carrier signal. Another subset of kernel pulses can be modulated by a second carrier signal. Further sets of kernel pulses can be modulated by further carrier signals. Advantageously, on the receiver side, different sets of kernel pulses can then be distinguished by modulating them with different carrier signals. For example, consecutive transmission pulses that are generated by different stages of the device can be modulated (that means their kernel pulses can be modulated) by different carrier signals. In order to modulate different subset of kernel pulses with different carrier signals the device can be equipped with different modulation means, wherein each modulation means is configured to modulate one subset of kernel pulses with a single carrier signal.

An embodiment of the first aspect relates to a device for generating a transmission pulse, configured to invert at least partly one or more kernel pulses on the basis of a polarity of a lobe of the pulse shape;

wherein the device is configured to encode a duration of an inversion in a phase orientation and/or a frequency of a carrier signal used to modulate the respective kernel pulse. Furthermore, the information for inverting at least partly one or more kernel pulses can be encoded by using a carrier signal for kernel pulses that should not be inverted and by using no carrier signal for kernel pulses that should be inverted (or vice versa).

In this case, the phase of a carrier signal used to modulate a kernel pulse which should be amplified in a positive signal dimension (for a positive lobe) is different from a phase of a carrier signal used to modulate a kernel pulse which should be amplified in a negative signal dimension (for a negative lobe). Additionally or alternatively, this can also be achieved by using carrier signals with different frequencies and/or mean values for positives and negative lobes of a transmission pulse.

An embodiment of the first aspect relates to a device for generating a transmission pulse, configured to provide a kernel pulse out of a pre-defined set of kernel pulses.

Advantageously by defining that the device can only produce a predefined set of kernel pulses, the device can be realized with less complexity then if the device would be configured for arbitrary kernel pulses. Predefined subsets of kernel pulses can in particular defined by their amplitudes. In this case a weighting needs not to be imposed by a later gain stage. Additionally or alternatively, the predefined set of kernel pulses can be defined by their time duration.

An embodiment of the first aspect relates to a device for generating a transmission pulse, wherein the number of kernel pulses in the set of kernel pulses depends on a pre-defined combination scheme.

Such a scheme can in particular be a scheme like Pascals Triangle (Pingala's Meru Prastara) to provide a set of kernel pulse types that have pre-defended amplitudes or that have a uniform amplitude and that can be amplified to a set of kernel pulses with pre-defined amplitudes. By combining these different kernel pulses a larger number of transmission pulses can be generated. For example, a device can be configured for kernel pulse types with amplitudes of 1, 2, 3, . . . , n. By a combination of these kernel pulse types, transmission pulses with an amplitude between 0 and $A\_n=n$ $(n+1)/2$ can be generated.

An embodiment of the first aspect relates to a device for generating a transmission pulse, configured to provide a pre-defined set of transmission pulse types.

In particular, a device according to the first aspect can be configured to generate only a predefined set of transmission pulse types. For example it can be configured to only provide one or two kinds of transmission pulse types. For example, this can be a transmission pulse type for LRP-communication and another transmission pulse type for HRP-communication. These two types of transmission pulses can be generated by a predefined set of kernel pulses. Hence, the number of kernel pulses in the set of possible kernel pulses can depend on a number of pre-defined transmission pulses. A predefined set of kernel pulses can be in particular provided based on a desired quantization accuracy. By constraining the device to only few types of transmission pulses, the device can be implemented with less complexity.

A second aspect relates to a method for generation of a transmission pulse, comprising the steps:

obtaining, in particular receiving or fetching, information about a pulse shape;

providing a sum of kernel pulses on the basis of the pulse shape;

integrating the kernel pulses to form a transmission pulse.

A third aspect relates to a computer program for generating a transmission pulse, wherein the computer program generates a transmission pulse based on a plurality of kernel pulses when executed on a computer.

SHORT DESCRIPTION OF THE FIGURES

Further advantages and features result from the following embodiments, which refer to the figures. The figures describe the embodiments in principle and not to scale. The dimensions of the various features may be enlarged or reduced, in particular to facilitate an understanding of the described technology. For this purpose, it is shown, partly schematized, in:

FIG. 1 a transmission pulse;

FIG. 2*a* an LRP-transmission-pulse;

FIG. 2*b* an HRP-transmission-pulse;

FIG. 3 a structure of a device for generating a transmission pulse;

FIG. 4 a generation of overlapping transmission pulses;

FIG. 5 a device with multiple stages in order to generate an output signal with overlapping transmission pulses;

FIG. 6 a structure of the amplification means of a device with multiple stages.

In the following descriptions, identical reference signs refer to identical or at least functionally or structurally similar features.

In the following description reference is made to the accompanying figures which form part of the disclosure, and which illustrate specific aspects in which the present disclosure can be understood.

In general, a disclosure of a described method also applies to a corresponding device (or apparatus) for carrying out the method or a corresponding system comprising one or more devices and vice versa. For example, if a specific method step is described, a corresponding device may include a feature to perform the described method step, even if that feature is not explicitly described or represented in the figure. On the other hand, if, for example, a specific device is described on the basis of functional units, a corresponding method may include one or more steps to perform the described functionality, even if such steps are not explicitly described or represented in the figures. Similarly, a system can be provided with corresponding device features or with features to perform a particular method step. The features of the various exemplary aspects and embodiments described above or below may be combined unless expressly stated otherwise.

Advantageously, by integrating pulses with the same start time and/or with the same end time a higher flexibility in resembling the desired pulse shape 201 by the quantized pulse shape 206 can be obtained.

Figure 1:
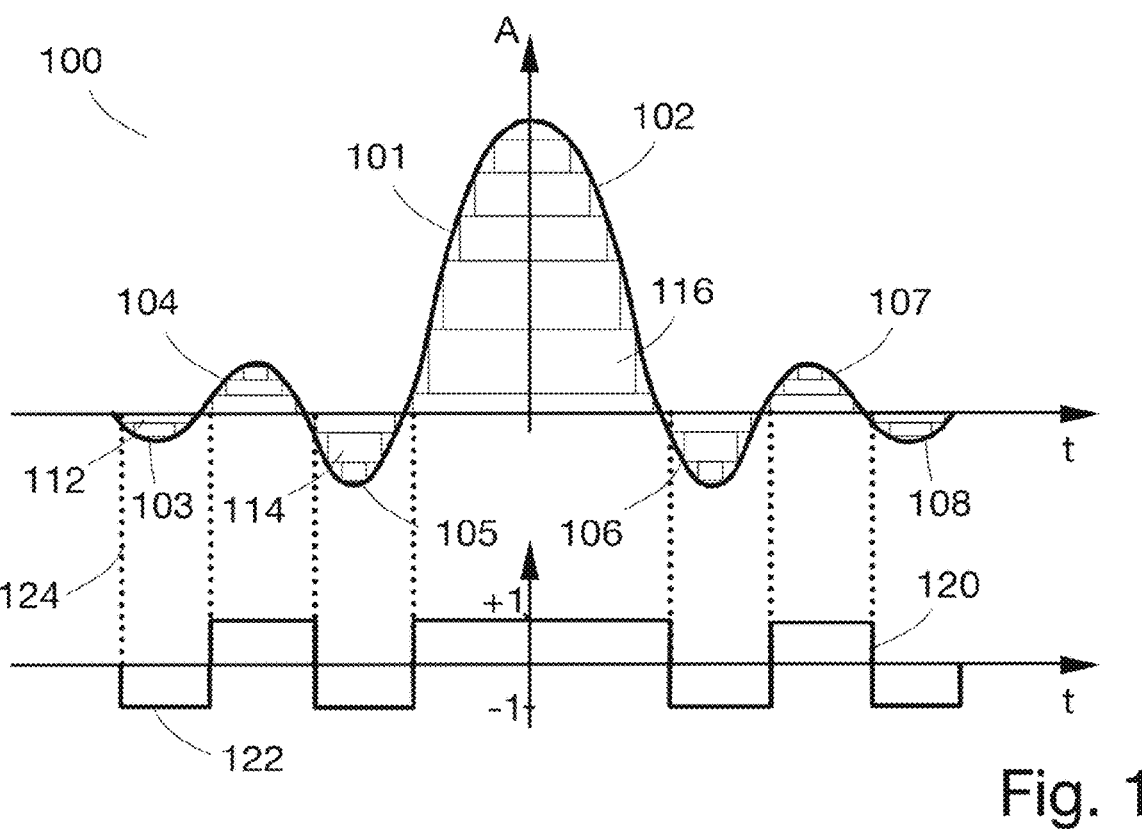
FIG. 1 discloses a transmission pulse 100 generated by a device according to an embodiment of this disclosure. The device is configured to obtain a pulse shape 101 for of the desired transmission pulse. The pulse shape 101 comprises three precursors 103, 104, 105 and three successors 106, 107, 108. Furthermore, the pulse shape 101 is a multipolar pulse shape with positive lobes 102, 104, 107 and negative lobes 103, 105, 106, 108. In order to generate a transmission pulse with the pulse shape 101, rectangular kernel pulses 112, 114, 116 are formed that provide a quantized signal when integrated. The quantized signal resembles the desired pulse shape 101. The kernel pulses 112, 114, 116 are generated initially as digital pulses with a single amplitude and only differing in time duration. That means, there are longer and shorter kernel pulses. In order to form the negative lobes 103, 105, 106, 108 the digital kernel pulses are inversed to a negative signal dimension. This is governed by the inversion signal 120. An inverted kernel pulse is defined by a negative inversion signal 122. The inversion signal defines the start time 124 of the kernel pulse. The normal and inverted kernel pulses are amplified by a pre-defined gain factor. This is explained in more detail in FIG. 6. The gain factors for each kernel pulse are determined by the device such that the sum of the amplified kernel pulses forms the quantized transmission pulse. Advantageously, by this method arbitrary pulse shapes can be generated, in particular pulse shapes that differ in PAPR, or in a number and polarity of precursors or successors.
Figure 2A:
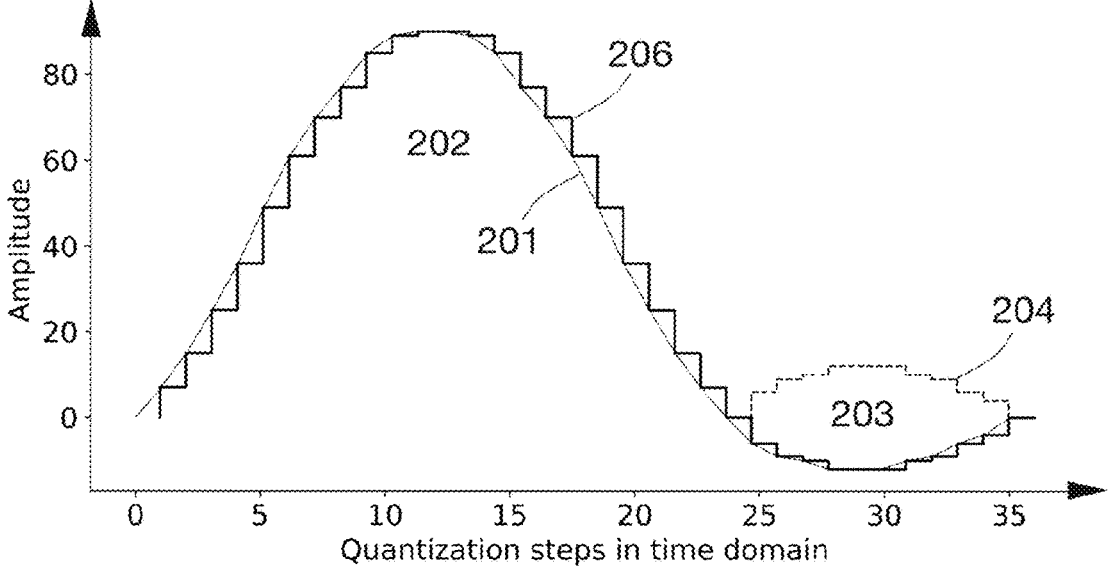
FIG. 2*a* discloses a transmission pulse 206 as generated by a device according to an embodiment of the present disclosure. The transmission pulse can be used as an UWB-LRP-transmission-pulse. It comprises a main lobe 202 and a single negative successor 203. The transmission pulse is based on an obtained pulse shape 201. The main lobe 202 of the transmission pulse 206 consists of amplified rectangular kernel pulses with the amplitudes 7, 8, 10, 11, 13, 12, 9, 7, 8, 4, and 1. When integrated together, these amplified kernel pulses form the positive lobe 202 of the quantized transmission pulse 206. The negative lobe 203 of the depicted transmission pulse is provided by amplified kernel pulses with the amplitudes 4, 2, 3, 1, and 2. The integration of these kernel pulses will lead to a positive lobe 204. In order to form the negative lobe 203 of the desired pulse shape 201, the kernel pulses forming the positive successor lobe 204 have to be inverted. This is performed by an additional signal (not shown). The signal indicates that the respective kernel pulses have to be amplified with a negative amplitude. This can be done for example by a distinct signal or by a pre-defined phase orientation of a carrier signal that modulates the kernel pulses before amplification. By detecting the phase orientation the amplifier knows if the kernel pulse has to be amplified positively or negatively. As can be seen, the transmission pulse is quantized by uniform time quantization. The positive lobe 202 is formed by amplified kernel pulses that have an equal time difference of 1. The negative lobe 203 is formed by amplified and inverted kernel pulses that differ either by a time difference of 1 or that have at least the same start time. Two kernel pulses start at quantization time step 24 and two pulses start at quantization time step 25. All pulses however are ending at different time steps. Also thereby a uniform quantization is achieved.
Figure 2B:
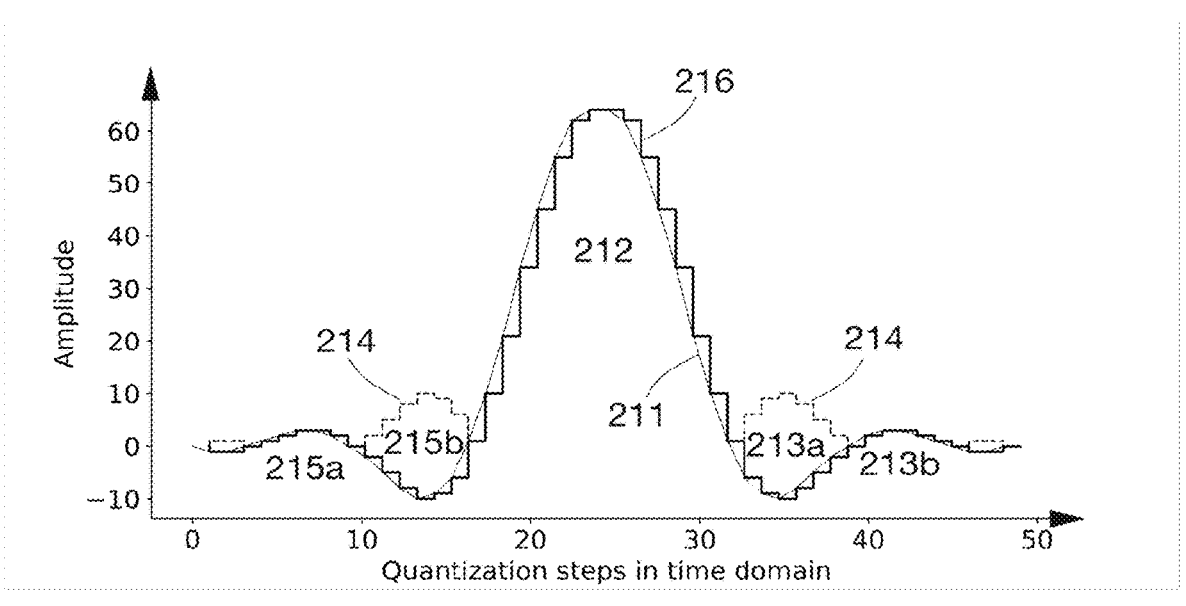

FIG. 2b discloses another transmission pulse 216 as generated by a device according to an embodiment of the present disclosure. Both transmission pulse types, the transmission pulse 206 of FIG. 2a and the transmission pulse 216 of FIG. 2b, can be generated by the same device. The transmission pulse 216 can be used as an UWB-HRP-transmission pulse. It comprises a main lobe 212, precursors 215a, 215b, and successors 213a, 213b. The transmission pulse is based on an obtained pulse shape 211. Analogously to transmission pulse 206 of FIG. 2a, the transmission pulse 216 consists of amplified kernel pulses with various amplitudes. When integrated together, these amplified kernel pulses form the quantized transmission pulse 216.

Figure 3:
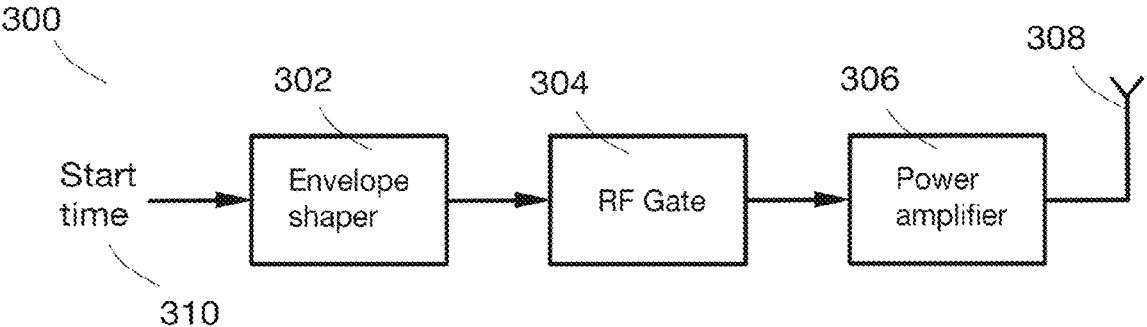

FIG. 3 discloses a structure of a device 300 for generating a transmission pulse according to an embodiment of the present disclosure. The device comprises an envelope shaper 302, an RF gate 304, a power amplifier 306, and an antenna 308. The envelope shaper 302 obtains information 310 on the transmission pulse. This information can comprise a desired pulse shape, a starting time, an accuracy with which the pulse shape should be quantized and/or information with respect to how pulses can overlap in the desired communication scheme, for example a spreading factor. Based on this information the envelope shaper generates a plurality of kernel pulses that have the same amplitude but differ in duration. By the kernel pulses the time quantization of the transmission pulse is defined. Furthermore, the envelope shaper 302 generates information on how to invert certain kernel pulses in order to account for negative lobes of the desired pulse shape. The RF gate 304 provides an input buffer for the amplifier 306. Furthermore, the RF gate 304 modulates the kernel pulses with one or more carrier signals. This means, the rectangular kernel pulses are used to gate the carrier signal. In the RF gate also the phase inversion based on the inversion information is carried out. The modulated and correctly phased kernel pulses are then passed to the power amplifier 306. At the power amplifier 306 the modulated and correctly phased kernel pulses are amplified with an amplification factor that is pre-defined for each kernel pulse. By this weighting, an amplitude quantization of the transmission pulse is carried out. The accumulated weighted kernel pulses represent the desired transmission pulse, which can then be forwarded to the antenna 308.

Figure 4:
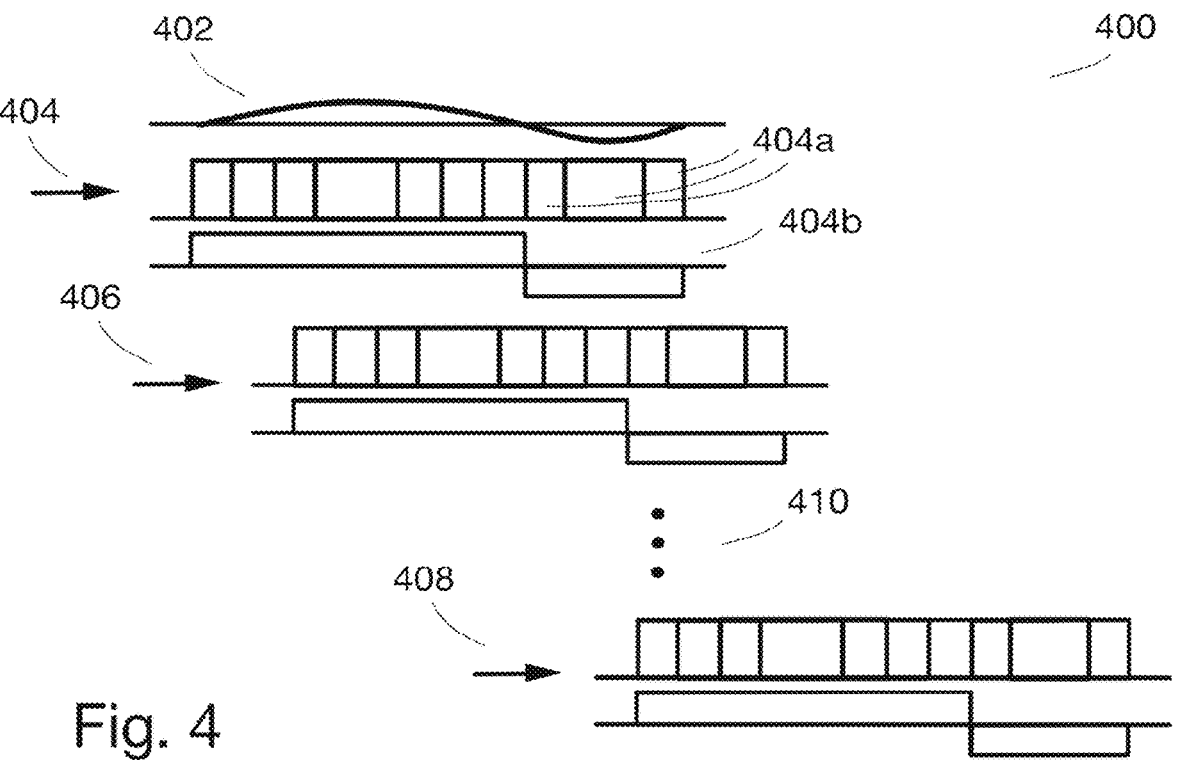

FIG. 4 discloses the generation of overlapping transmission pulses according to an embodiment of the disclosure. A device for generating a series of transmission pulses is equipped with a plurality of stages 404, 406, 408. Each stage is configured to form a transmission pulse 402. Therefore, each stage is configured to generate kernel pulses 404a with the same amplitude and different durations. Furthermore, each stage is configured to amplify the different kernel pulses according to a weighting related to each kernel pulse individually. In order to generate multipolar transmission pulses each stage is further configured to provide a signal that indicates if the kernel pulses have to be amplified positively or negatively. This can be done, for example, by a digital signal 404b. Depending on the length of the transmission pulse 402 and the lengths of a symbol in which the transmission pulse is sent several transmission pulses 402 can overlap. However, one stage can only generate a single transmission pulse at once. In order to independently generate transmission pulses within a single symbol period a certain number of stages is needed. For example, if a transmission pulse is eight quantization steps (or any other time period) long and a symbol duration is also eight quantization steps long, then eight stages are needed such that during one symbol duration a new transmission pulse can be started at each quantization step. In a related embodiment a stage comprises substages such that a single stage can generate more than one transmission pulse concurrently. Then correspondingly less stages are necessary.

Figure 5:
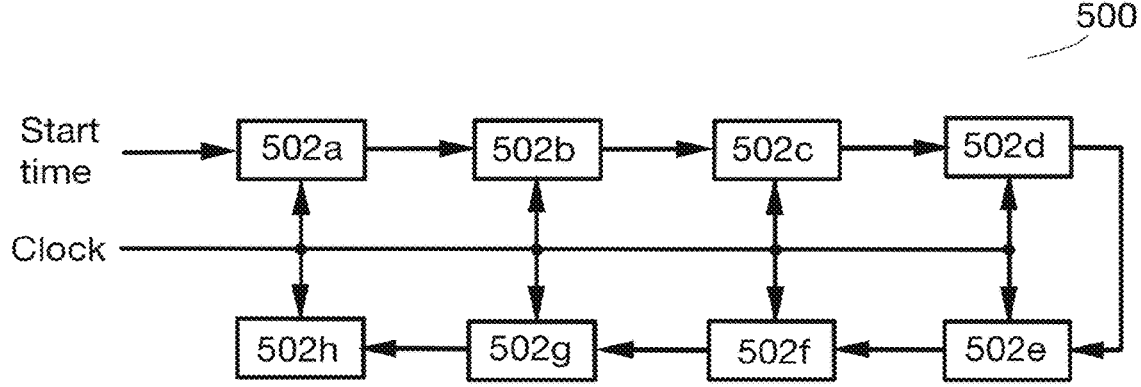

FIG. 5 shows the structure of a device 500 with multiple stages 502a-502h for generating an output signal with overlapping transmission pulses. A start time is provided to a first stage 502a. The first stage 502a is configured to generate the first transmission pulse beginning at the start time and ending after eight quantization steps. Afterwards, a second transmission pulse can be generated by a second stage at one quantization step after the start time. Additional transmission pulses can be generated starting at each further quantization step, analogously. In order to start generating the transmission pulse at the correct time instance, all stages 502a-502h are synchronized by a clock signal.

Figure 6:
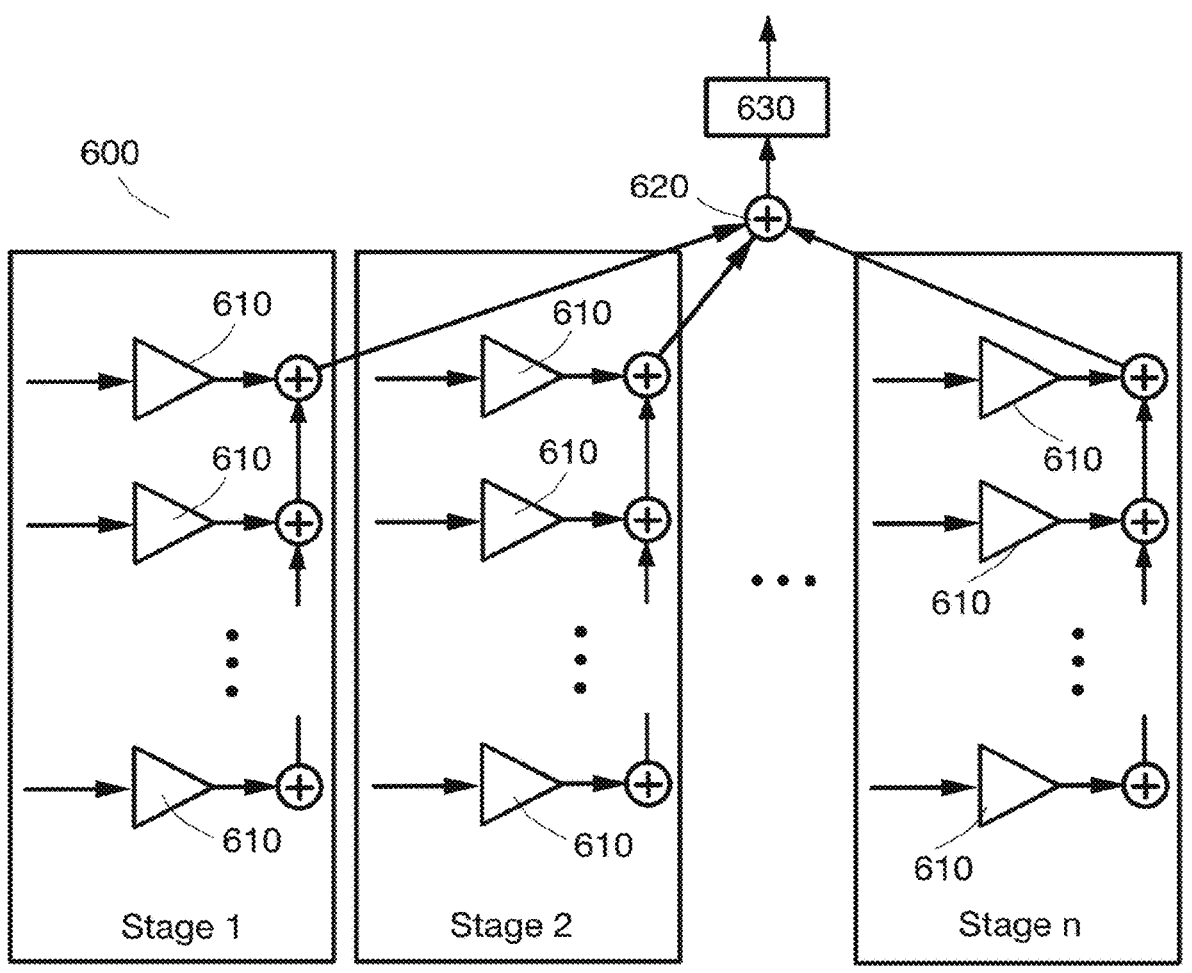

FIG. 6 discloses a structure of the amplification means of a device with multiple stages (Stage 1-Stage n) according to an embodiment of the present disclosure. Each stage comprises a plurality of amplifiers 610. Each amplifier 610 is configured to amplify a single kernel pulse with a predefined gain factor.

The weighted kernel pulses are then integrated by summation in order to achieve a single transmission pulse of the respective stage. The transmission pulse signals of each stage are then in turn integrated by summation 620 and provided to transmitter 630. The summation of the amplified kernel pulses and/or the transmission pulse signals of each stage can be performed by current summation.

The disclosed embodiments can be in particular used for UWB-IR. This is explained in the following.

As mentioned previously, no system exists today which can address both the HRP- and LRP-communication types. From a transmitter perspective, one of the major issues with a radio capable of addressing both communication types is the RF front end. The difficulty of designing a flexible RF front end arises due to the following differences between these communication types.

1) Different Pulse Shapes:

Both LRP-communication and HRP-communication support different envelope pulse shapes. In case of HRP, pulses with and without precursors are supported. If the pulse has precursors, then it can be a Root-Raised Cosine shape with, for example, +/−3 chip periods. This pulse shape is shown in FIG. 2b. Without a precursor, the pulse shape can include successors that extend over, for example, four chip periods. The latter pulse shape is shown in FIG. 2a. In case of LRP-pulses, the monotonous rise time of the pulse is specified by the standard. Optionally, a single successor can be implemented. The precursors and the successors in the transmission pulses can have different amplitudes and shapes as well. In addition, since they involve a 180° phase shift of the envelope, the desired pulse generation device should be capable of handling this phase flipping as well as the different rise and fall times dictated by these pulse shapes.

2) Different Pulse Repetition Frequency:

HRP- and LRP-communication have different pulse repetition frequencies (PRF). HRP-communication has a PRF defined by PRF_HRP=ChipRate/SpreadingFactor. The Chip Rate is fixed at 499.2 MHz and the spreading factor changes according to the packet definition (1, 2, 4 or 8). Hence, the actual PRF of HRP-communication can be either 62.4 MHz, 124.8 MHz, 249.6 MHz or 499.2 MHz. Since the transmission pulse extends over multiple chip periods, this can lead to side-lobes (precursors and successors) of multiple transmission pulses overlapping each other. For LRP-communication, the PRF is either 1, 2 or 4 MHz and hence the problem of overlapping pulses does not arise.

3) Different Modulation Techniques and Output Power:

HRP-communication can use Binary Phase Shift Keying (BPSK) modulation. While in itself this is not a major issue, the overlapping sidelobes of HRP-transmission-pulses mean that due to the phase modulation the sidelobes may constructively or destructively interfere and subsequently the PAPR of transmission signal can be large as compared to the PAPR of the individual transmission pulse. In case of LRP-communication, the modulation and pulse overlap are less of an issue since it uses Binary Frequency Shift Keying (BFSK) at low PRF. But an LRP-transmission-pulse comprises more peak power per pulse as opposed to an HRP-pulse. In addition, if a successor is chosen to be implemented to improve spectral efficiency, the PAPR can be large as well. The desired device provides a linear transmitting circuitry which can transmit both the high powered and the low powered pulses with little distortion.

4) Different Power Consumption:

LRP-radios operate primarily in power-autonomous systems, it is imperative that the power consumption of a desired devices should be kept as small as possible.

In view of these differences, there is a need for a transmission (TX) pulse generation method and device that is adaptable and linear over a large output power range and that has a low-power consumption. With such a method transmission pulses for LRP- and HRP-communication should be generated.

The following embodiment solves this problem.

A modular TX Front End is based on Pingala's Meru Prastara (Pascal's Triangle). Given any set of natural numbers 1, 2, 3, . . . , n, any number between 0 and A_n=n(n+1)/2 can be expressed as a linear combination of these numbers. By using a set of gain stages with relative gains unitarily increasing up to n, any envelope pulse shape with a peak amplitude between 0 and A_n can be generated. Now, since LRP has a higher transmission pulse amplitude, the peak of the LRP amplitude can be represented by A_n. Subsequently, the peak amplitude of the HRP pulse will be represented by some number less than A_n. In addition, since the chip rate of an HRP-signal is 499.2 MHz, the time quantization of the pulse is dictated by the Nyquist criterion to be at least 2*499.2 MHz. These quantized HRP- and LRP-transmission pulses are depicted in FIG. 2a and FIG. 2b.

An implementation of the TX Front End 300 consists of an Envelope Shaper 302, a RF Gate 304 and a Power Amplifier 306 coupled to an antenna 308, as shown in FIG. 3. Such a structure is of course not restricted to UWB-IR.

The Envelope Shaper 302 provides a time quantization of the pulse shape. An amplitude quantization and a pulse combination is provided by the Power Amplifier 306. The RF Gate 304 performs three functions: It is configured to serve as an input buffer for the Power Amplifier 306, it performs a gating of the RF-carrier signal using time-quantized output of the Envelope Shaper 302 and it performs a phase inversion for modulation and for forming side-lobes of the transmission pulse. The Envelope Shaper 302 can have two inputs, a transmission pulse start signal and a clock. If a maximum transmission pulse duration is +/−3 chip periods, the total spread of the transmission pulse is six chip periods. The transmission pulses can be spaced 1, 2, 4 or 8 chip periods (spreading factor) apart. Since the Envelope Shaper 302 shall be configurable to each of these spreading factors, the Envelope Shaper 302 has eight stages. Each stage is responsible for producing one complete transmission pulse. Each stage 502a-502g of the Envelope Shaper 302 triggers the following stage 502b-502h. The last stage 502h can trigger the first stage 502a in a circular manner. This is for an operation in case of a spreading factor of 1. For higher spreading factors, some of the Envelope Shaper stages are not used. Such a structure is depicted in FIG. 5.

The Envelope Shaper 302 operates as follows. The start signal is shifted by half a clock period consecutively by a set of dynamic latches over eight chip periods. Then by a linear combination of these shifted signals, kernel pulses of different durations are produced. The desired pulse shape is obtained by a linear combination of weighted kernel pulses. The weighting is performed by the power amplifier 306. After the shift of at least eight chip periods has occurred, the next Envelope Shaper stage is enabled depending upon the spreading factor. Furthermore, the Envelope Shaper 302 also produces a sign signal which determines if there is an inversion of the kernel pulses that needs to be carried out in order to generate negative side lobes.

Before the Power Amplifier 306, the RF Gate 304 receives the time-quantized envelope input, i.e. the kernel pulses, from the Envelope Shaper 302 as well as a radio frequency carrier signal with which the kernel pulses are modulated. The carrier signal is gated by the quantized envelope input and the correct phase is applied to them using simple logic gates. Rail-rail signals can drive the logic gates. This can ease the design process and a stable input to the power amplifier 306 can be provided, independent of a supply voltage. From the power amplifier the transmission signal is provided to the antenna 308.

LIST OF REFERENCE SIGNS 100 transmission pulse
101 pulse shape
102 positive main lobe
103 negative lobe
104 positive lobe
105 negative lobe
106 negative lobe
107 positive lobe
108 negative lobe
112 inverted pulse
114 inverted pulse
116 positive kernel pulse
120 inverted signal
122 part of inversion signal defining an inversion
124 time instance of beginning of an inversion
201 pulse shape
202 positive lobe
203 negative lobe
204 summation of weighted kernel pulses before inversion
206 quantized transmission pulse
211 pulse shape
212 positive lobe
213a successor
213b successor
214 summation of weighted kernel pulses before inversion for negative lobe
215a precursor
215b precursor 216 quantized transmission pulse
300 structure of device
302 envelope shaper
304 RF gate
306 power amplifier
308 antenna
310 information about transmission pulse
400 overlapping transmission pulse generation
402 pulse shape
404 first stage
404*a* kernel pulses
404*b* inversion signal
406 second stage
408 last stage
410 indication of further stages
500 structure and operation of a device with multiple stages
502*a*-502*h* stage 1 to stage 8
600 structure and operation of multiple stages and their amplifiers
610 amplifier
620 summation of transmission pulses
630 output matching

The invention claimed is:

1. A device for forming a transmission pulse, in particular an UWB-chip-pulse having a plurality of lobes with different polarity, configured to:

obtain information about a transmission pulse, wherein the information comprises a pulse shape;

form a plurality of kernel pulses on the basis of the pulse shape;

invert at least partly one or more kernel pulses on the basis of the polarity of a lobe of the pulse shape, wherein the inversion of a kernel pulse depends on a minimum and/or a zero-crossing of the pulse shape; and/or a minimum of a non-negative pulse formed by integrated kernel pulses;

adapt a pulse amplitude formed by integrated kernel pulses such that one or more minima are changed from a non-zero value to zero;

form a transmission pulse based on the plurality of kernel pulses.

2. The device according to claim 1, wherein the kernel pulses are based on a pre-defined time quantization.

3. The device according to claim 1, wherein the kernel pulses are based on a quantization resolution; and wherein the quantization resolution is in particular comprised in the information about the transmission pulse.

4. The device according to claim 1, wherein the transmission pulse and/or one or more kernel pulses are based on a starting time; and wherein the starting time is in particular comprised in the information about the transmission pulse.

5. A device for forming a transmission pulse, in particular an UWB-chip-pulse, configured to:

obtain information about a transmission pulse, wherein the information comprises a pulse shape;

form a plurality of rectangular kernel pulses on the basis of the pulse shape;

form a transmission pulse based on the plurality of kernel pulses, wherein the transmission pulse is formed by addition of the rectangular kernel pulses, wherein said device is configured to modulate kernel pulses with a pre-defined carrier signal, wherein said device is configured to invert at least partly one or more of the plurality of rectangular kernel pulses on the basis of a polarity of a lobe of the pulse shape, and wherein the device is configured to encode a duration of an inversion in a phase and/or frequency of a carrier signal used to modulate the respective kernel pulse.

6. The device according to claim 1, configured to form a plurality of transmission pulses concurrently, in particular based on an information relating to a time between two consecutive transmission pulses.

7. The device according to claim 6, configured to integrate the plurality of transmission pulses, in particular by current summation.

8. The device according to claim 1, configured to provide a kernel pulse out of a pre-defined set of kernel pulse types; and/or a transmission pulse out of a pre-defined set of transmission pulse types.

9. The device according to claim 8, wherein the number of kernel pulses in the set of kernel pulses depends on a pre-defined combination scheme.

10. The device of claim 1, whereby the addition is performed by current summation.

11. The device of claim 1, whereby the transmission pulse is generated in a stage, that comprises a plurality of amplifiers, whereby each amplifier amplifies a kernel pulse with a predefined gain factor, and the amplified kernel pulses are then integrated by summation to achieve the transmission pulse.

* * * * *